(12) United States Patent
Mioni et al.

(10) Patent No.: US 12,101,027 B2
(45) Date of Patent: Sep. 24, 2024

(54) BULK SWITCHING CIRCUITRY

(71) Applicant: Nordic Semiconductor ASA, Trondheim (NO)

(72) Inventors: Daniel Pasti Mioni, Trondheim (NO); Jarmo Väänänen, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 260 days.

(21) Appl. No.: 17/750,932

(22) Filed: May 23, 2022

(65) Prior Publication Data

US 2022/0385189 A1    Dec. 1, 2022

(30) Foreign Application Priority Data

May 25, 2021    (FI) ...................................... 20215614

(51) Int. Cl.
 *H02M 3/156*   (2006.01)
 *H01L 27/02*   (2006.01)
 (Continued)

(52) U.S. Cl.
 CPC ...... *H02M 3/1566* (2021.05); *H01L 27/0266* (2013.01); *H02M 3/158* (2013.01); *H03K 17/6871* (2013.01)

(58) Field of Classification Search
 CPC . H02M 3/1566; H02M 3/158; H01L 27/0266; H03K 17/6871; H03K 17/687;
 (Continued)

(56) References Cited

U.S. PATENT DOCUMENTS 5,767,733 A    6/1998  Grugett
9,443,845 B1 *  9/2016  Stafanov ............. H01L 27/0727
 (Continued)

FOREIGN PATENT DOCUMENTS

EP    0021714 B1 *  6/1980
EP    3 249 815     11/2017
 (Continued)

OTHER PUBLICATIONS

Extended European Search Report issued on Sep. 28, 2022 in corresponding European Application No. 22173424.7, 9 pages.
Search Report for FI20215614, dated Feb. 2, 2022, 2 pages.

*Primary Examiner* — Metasebia T Retebo
(74) *Attorney, Agent, or Firm* — Nixon & Vanderhye PC

(57) ABSTRACT

According to an aspect, there is provided an apparatus comprising: a bulk-controlled switch circuit comprising a first transistor coupled to a load and having a source coupled to a source voltage and a drain coupled to a drain voltage, a second transistor and a third transistor coupled, in parallel with the first transistor, to one another in series between the source voltage and the drain voltage, wherein a bulk of the first transistor is coupled with bulks of the second transistor and the third transistor, wherein a gate of the second transistor is coupled to the source voltage via a first impedance circuit and a gate of the third transistor is coupled to the drain voltage via a second impedance circuit to form a comparator switch controlled by the source voltage and the drain voltage and to dynamically switch a greater one of the source voltage and the drain voltage to the load; a first current generator circuit and a second current generator circuit; a first current mirror circuit biased by the first current generator circuit, responsive to the source voltage, and configured to trigger the second transistor to couple the source voltage to the load when the source voltage is above the drain voltage; a second current mirror circuit biased by (Continued)

the second current generator circuit, responsive to the drain voltage, and configured to trigger the third transistor to couple the drain voltage to the load when the drain voltage is above the source voltage.

11 Claims, 5 Drawing Sheets

(51) Int. Cl.
*H02M 3/158* (2006.01)
*H03K 17/687* (2006.01)

(58) Field of Classification Search
CPC ........ H03K 2217/0018; H03K 17/6872; H03F 3/45179; H03F 2203/45024; H03F 2203/45026
See application file for complete search history.

(56) References Cited

U.S. PATENT DOCUMENTS

| | | | |
|---|---|---|---|
| 9,761,284 B1 * | 9/2017 | Hulub | H03K 17/687 |
| 10,498,330 B1 | 12/2019 | Delshadpour et al. | |
| 2005/0140441 A1 | 6/2005 | Cohen | |
| 2005/0275462 A1 | 12/2005 | Heightley et al. | |

FOREIGN PATENT DOCUMENTS

| | | |
|---|---|---|
| KR | 10-2009-0069363 | 7/2009 |
| WO | 2008/120123 | 10/2008 |
| WO | 2019/163417 | 8/2019 |

* cited by examiner

BULK SWITCHING CIRCUITRY

This application claims priority to FI patent application Ser. No. 20/215,614 filed May 25, 2021, the entire contents of which is hereby incorporated by reference.

TECHNICAL FIELD

Various example embodiments relate to power transistors and, particularly, to bulk switching transistor circuits.

BACKGROUND

Bulk switching transistor circuits may be used in implementations such as battery chargers, rectifiers, etc. In such implementations, a bulk of a (metal oxide semiconductor, MOS) power transistor may be dynamically switched between a source voltage and a drain voltage of the power transistor. Such dynamic switching may be preferable, for example, when the source and drain voltages are variable (floating switch). However, the switching should be fast to overcome adverse effects of parasitic couplings in the power transistor. FIG. 1 represents a conventional bulk switching circuit. When the source voltage VS raises above the drain voltage VD of the power transistor M0, transconductance of a switching transistor M2 decreases while the transconductance of a switching transistor M1 increases, thus coupling the source voltage to the bulk of the power transistor M0. Transconductance of transistor M1 is defined by the difference between VS and VD and, if this difference is lower than a threshold voltage of the transistor M1, coupling between the source voltage VS and a bulk voltage VB decreases. This causes the source voltage VS to leak via parasitic diode coupling illustrated in FIG. 1 to the bulks of the transistors M0, M1, M2. Similar leakage is present for the transistor M2. The leakage may cause unintended power leakage to a load of the bulk switching circuitry or even latch-up of the power transistor M0.

BRIEF DESCRIPTION

According to an aspect, there is provided an apparatus comprising: a bulk-controlled switch circuit comprising a first transistor (MP0) coupled to a load and having a source coupled to a source voltage (VS) and a drain coupled to a drain voltage (VD), a second transistor (MPA) and a third transistor (MPB) coupled, in parallel with the first transistor, to one another in series between the source voltage and the drain voltage, wherein a bulk of the first transistor is coupled with bulks of the second transistor and the third transistor, wherein a gate of the second transistor is coupled to the source voltage via a first impedance circuit (RU1) and a gate of the third transistor is coupled to the drain voltage via a second impedance circuit (RU2) to form a comparator switch controlled by the source voltage and the drain voltage and to dynamically switch a greater one of the source voltage and the drain voltage to the load; a first current generator circuit and a second current generator circuit (IDC1); a first current mirror circuit (MP3, MP4) biased by the first current generator circuit, responsive to the source voltage, and configured to trigger the second transistor to couple the source voltage to the load when the source voltage is above the drain voltage; a second current mirror (MP1, MP2) circuit biased by the second current generator circuit, responsive to the drain voltage, and configured to trigger the third transistor to couple the drain voltage to the load when the drain voltage is above the source voltage.

A technical effect of using the current mirror circuits biased by the current generator circuits is faster and more accurate switching and reduced leakage through the parasitic diode coupling described in Background.

In an embodiment, the apparatus further comprises constant current generators (IDC2, IDC3) as loads of the first current mirror circuit and the second current mirror circuit, respectively, and configured to generate a non-zero hysteresis to the comparator switch. A technical effect is that improved control in the bulk switching. The configuration of the hysteresis helps in avoiding false switching of the comparator due to thermal noise, for example.

In an embodiment, the constant current generators are configured to generate a different threshold voltage level for coupling the source voltage than a threshold voltage level for coupling the drain voltage. A technical effect is improved control in the bulk switching to prefer a certain voltage domain (a source voltage domain or a drain voltage domain)

In an embodiment, the first impedance circuit comprises a first resistor between the gate of the second transistor and the source voltage, and the second impedance circuit comprises a second resistor between the gate of the third transistor and the drain voltage. A technical effect of the resistor is that the switching can be performed even in a situation where the current generators are disabled.

In an embodiment, the first impedance circuit is coupled to the ground via a fourth transistor (MN2), and second impedance circuit is coupled to the ground via a fifth transistor (MN3), wherein the second current mirror circuit is coupled to a gate of the fourth transistor and the first current mirror circuit is coupled to a gate of the fifth transistor. A technical effect is improved control in the switching.

In an embodiment, the first transistor, second transistor, and the third transistor are positive metal oxide semiconductor, PMOS, transistors, and wherein the apparatus comprises at least one further PMOS transistor and at least one negative metal oxide semiconductor, NMOS, transistor, wherein bulks of all PMOS transistors are coupled to the same bulk voltage, and wherein bulks of all NMOS transistors are coupled to the ground. A technical effect is improved performance of the bulk switching.

In an embodiment, the first current mirror circuit and the second current mirror circuit each comprises a diode-coupled transistor (MP1, MP3) and a current source transistor (MP2, MP4), wherein the current source transistor (MP4) of the first current mirror circuit is coupled to a gate of a sixth transistor (MN4) driving a constant current source (IDC3) that is a load of the current source transistor (MP2) of the second current mirror circuit, and wherein the current source transistor (MP2) of the second current mirror circuit is coupled to a gate of a seventh transistor (MN1) driving a constant current source (IDC3) that is a load of the current source transistor (MP4) of the first current mirror circuit. Such an arrangement further improves the performance of the bulk switching.

In an embodiment, the first current mirror circuit is configured to, in response to the source voltage rising above the drain voltage, to increase coupling of the source voltage to the load while the second current mirror circuit is configured to increase decoupling of the drain voltage to the load, and wherein the second current mirror circuit is configured to, in response to the drain voltage rising above the source voltage, to increase coupling of the drain voltage to the load while the first current mirror circuit is configured to increase decoupling of the source voltage to the load. Such a dual functionality enables fast switching.

In an embodiment, at least one of the first current mirror circuit and the second current mirror circuit comprises a cascode of a plurality of current mirror circuits. The cascode improves accuracy of the bulk switching.

According to an aspect, there is provided a rectifier circuit comprising the apparatus of any one of the above-described embodiments.

According to an aspect, there is provided a charger device comprising the apparatus of any one of the above-described embodiments. The charger device may be a battery charger.

Embodiments are defined in the dependent claims. The scope of protection sought for various embodiments is set out by the independent claims.

The embodiments and features, if any, described in this specification that do not fall under the scope of the independent claims are to be interpreted as examples useful for understanding various embodiments of the invention.

BRIEF DESCRIPTION OF DRAWINGS

In the following, example embodiments will be described in greater detail with reference to the attached drawings, in which.

DETAILED DESCRIPTION OF SOME EMBODIMENTS

The following embodiments are examples. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

According to an embodiment, there is provided an apparatus comprising a bulk-controlled switch circuit comprising a first transistor coupled to a load and having a source coupled to a source voltage VS and a drain coupled to a drain voltage VD, a second transistor and a third transistor coupled, in parallel with the first transistor, to one another in series between the source voltage and the drain voltage, wherein a bulk of the first transistor is coupled with bulks of the second transistor and the third transistor, wherein a gate of the second transistor is coupled to the source voltage via a first impedance circuit and a gate of the third transistor is coupled to the drain voltage via a second impedance circuit to form a comparator switch controlled by the source voltage and the drain voltage and to dynamically switch a greater one of the source voltage and the drain volt-age to the load. The bulk-controlled switch circuit further comprises a first current generator circuit and a second current generator circuit. The bulk-controlled switch circuit further comprises a first current mirror circuit biased by the first current generator circuit, responsive to the source voltage, and configured to trigger the second transistor to couple the source voltage to the load when the source voltage is above the drain voltage. The bulk-controlled switch circuit further comprises a second current mirror circuit biased by the second current generator circuit, responsive to the drain voltage, and configured to trigger the third transistor to couple the drain voltage to the load when the drain voltage is above the source voltage.

Figure 1:
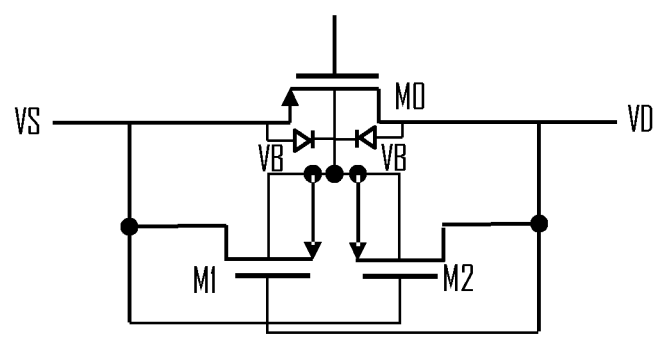
FIG. 1 illustrates a conventional bulk switching circuitry.

Referring to FIG. 1, the first, second and third transistors may correspond to the transistors M0, M1, and M2, respectively. As additional components to speed up the response to the change in the source voltage VS or the drain voltage, the current mirror circuits biased by the current generator circuits are provided. The biasing enables control for the switching, i.e. definition of a threshold voltage for the VS or VD when the switching is triggered. The current mirror arrangement improves the response time to the change, as described in greater detail below.

Figure 2:
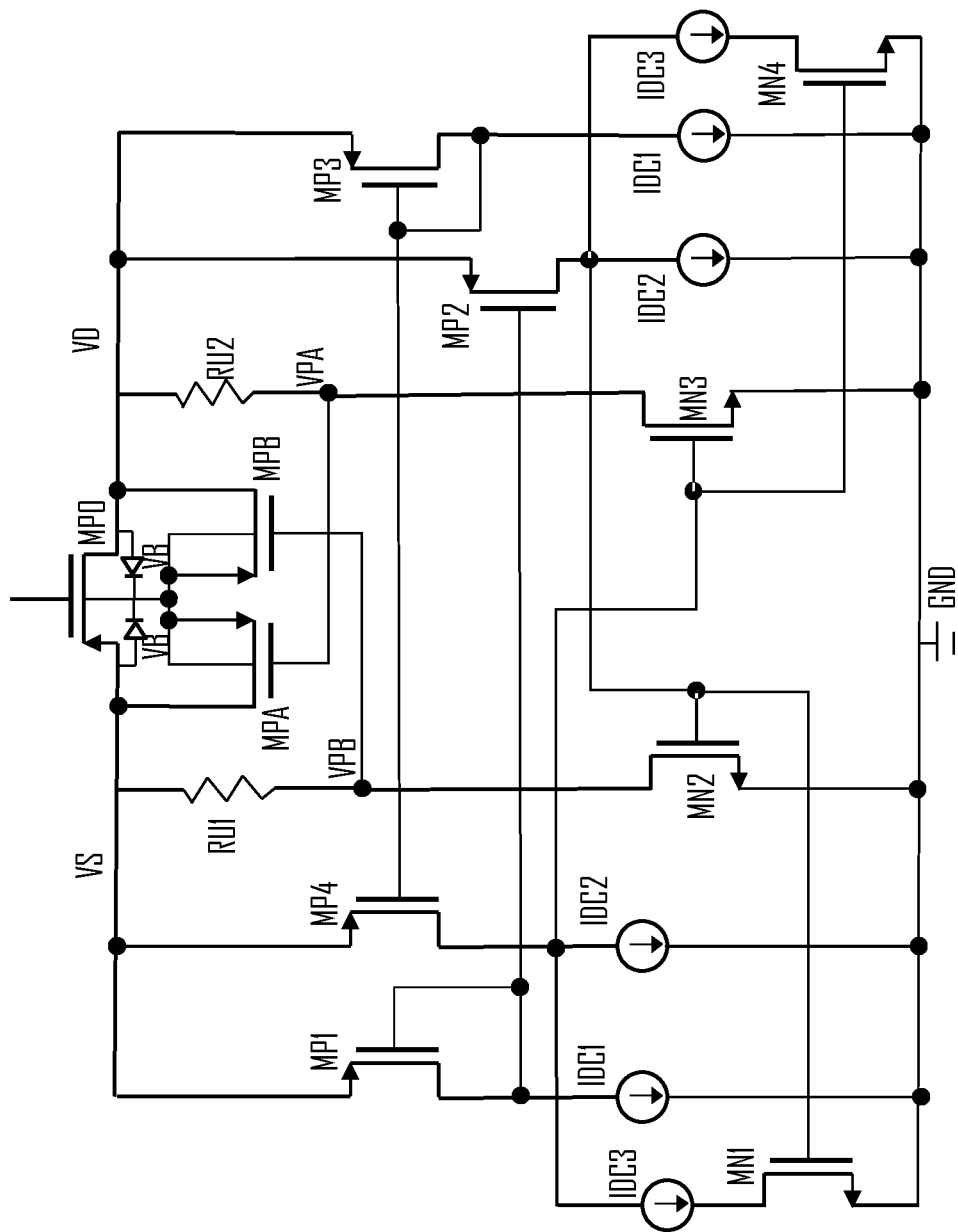
FIG. 2 illustrates a bulk switching circuitry according to an embodiment.

FIG. 2 illustrates an embodiment of a circuit comprising the above-described apparatus. In FIG. 2, the first, second, and third transistors are denoted by MP0, MPA, and MPB, respectively. As illustrated in FIG. 1, the power transistor MP0 is coupled between the VS and VD in parallel with the switching transistors MPA and MPB that are arranged in series. In particular, the sources of the transistors MPA and MPB are coupled together, the drain of the transistor MPA is coupled to the source voltage VS, and the drain of the transistor MPB is coupled to the drain voltage VD. The source of the transistor MP0 is coupled to the source voltage VS and the drain of the transistor MP0 is coupled to the drain voltage VD. Bulks of the transistors are coupled together, and a bulk voltage is represented by VB. A gate of the transistor MPA is coupled to the drain voltage VD via the second impedance circuit RU2, while a gate of the transistor MPB is coupled to the source voltage VS via the first impedance circuit is RU1. The transistors MP0, MPA, MPB are in this embodiment positive metal oxide semiconductor (PMOS) transistors.

The first current mirror circuit is represented by a diode-connected transistor MP3 and a transistor MP4 that is coupled to and responsive to the source voltage VS, while the second current mirror circuit is represented by the diode-connected transistor MP1 and a transistor MP2 that is coupled to and responsive to the drain voltage VD. The first current generator circuit is represented by the current source IDC1 coupled to the gates of the transistors MP3 and MP4, while the second current generator circuit is represented by the current source IDC1 coupled to the gates of the transistors MP1 and MP2. As illustrated in FIG. 2, the current sources IDC1 define the bias voltages of the first and second current mirror circuit by contributing to the respective gate voltages of the transistors MP1 to MP4. In an embodiment, the current sources IDC1 maintain the gate voltages of the current mirror transistors MP1 to MP4 at a constant level.

While both current mirror circuits are coupled to both VS and VD, the coupling of the first current mirror circuit MP3, MP4 to the gate of MPA makes it responsive to selecting MPA when VS rises. Similarly, the coupling of the second current mirror circuit MP1, MP2 to the gate of MPB makes it responsive to selecting MPB when VD rises.

Further current mirrors IDC2 and IDC3 may be coupled to the drains of the current mirror circuits to draw current from the current mirrors (IDC2) and to introduce a hysteresis to the selection of MPA/MPB (IDC3). The hysteresis is described in greater detail with reference to FIG. 5 below.

The first current mirror circuit may be arranged to drive a first set of further transistors MN3, MN4. The transistor MN3 is coupled between the second impedance circuit RU2 and the ground, thereby driving the second impedance circuit and controlling the transistor MPA. The transistor MN4 operates as a switch, coupling selectively the current source IDC3 on the right in FIG. 2 to the ground, thus affecting the hysteresis, as described below. Similarly, the second current mirror circuit may be arranged to drive a second set of further transistors MN1, MN2. The transistor MN2 is coupled between the first impedance circuit RU1 and the ground, thereby driving the first impedance circuit RU1 and controlling the transistor MPB. The transistor MN1 operates as a switch, coupling selectively the current source IDC3 on the left of FIG. 2 to the ground, thus affecting the hysteresis, as described below.

Figure 3:
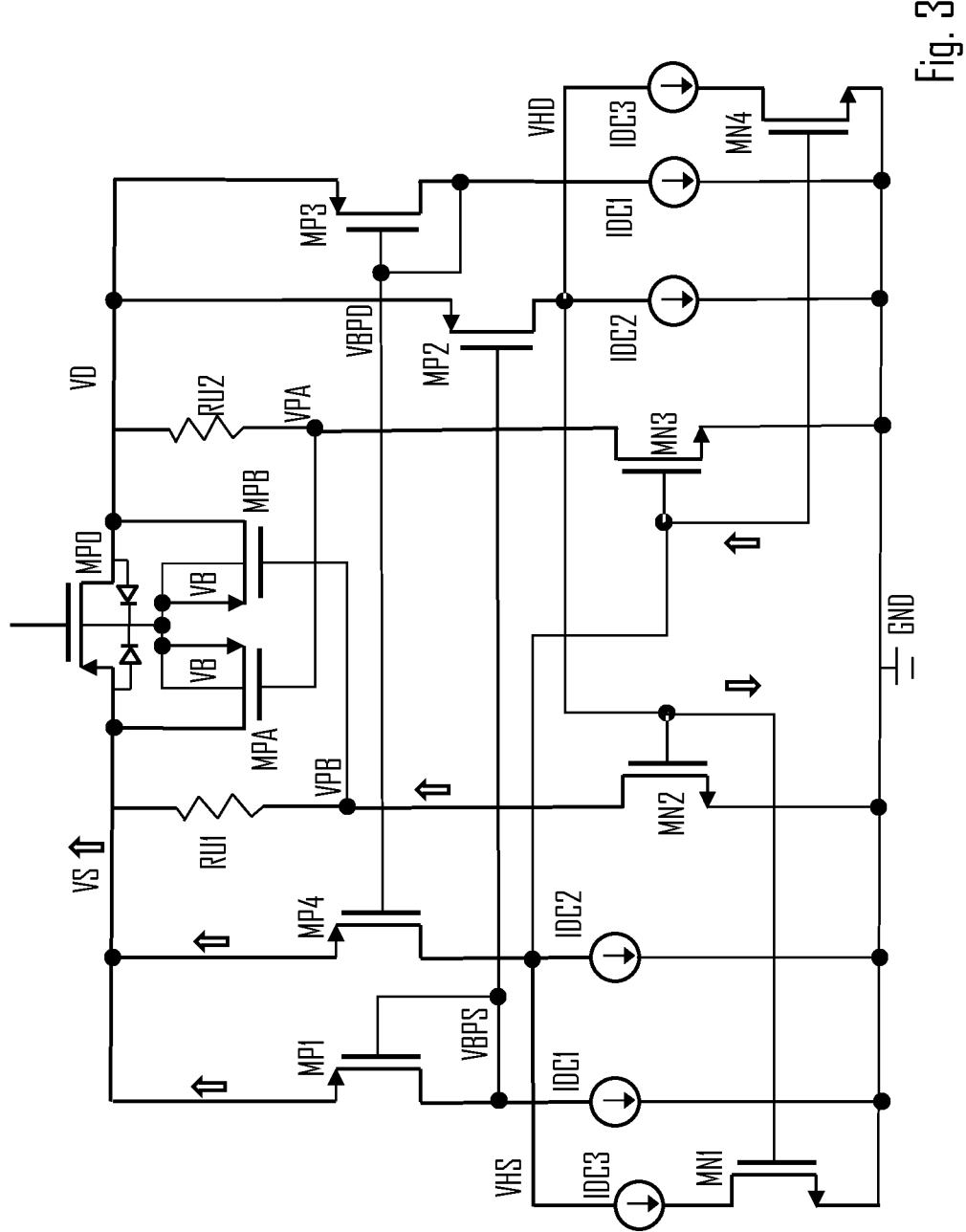
FIGS. 3 and 4 illustrate operation of the bulk switching circuitry of FIG. 2 when a source voltage changes with respect to a drain voltage over a threshold level.
Figure 4:
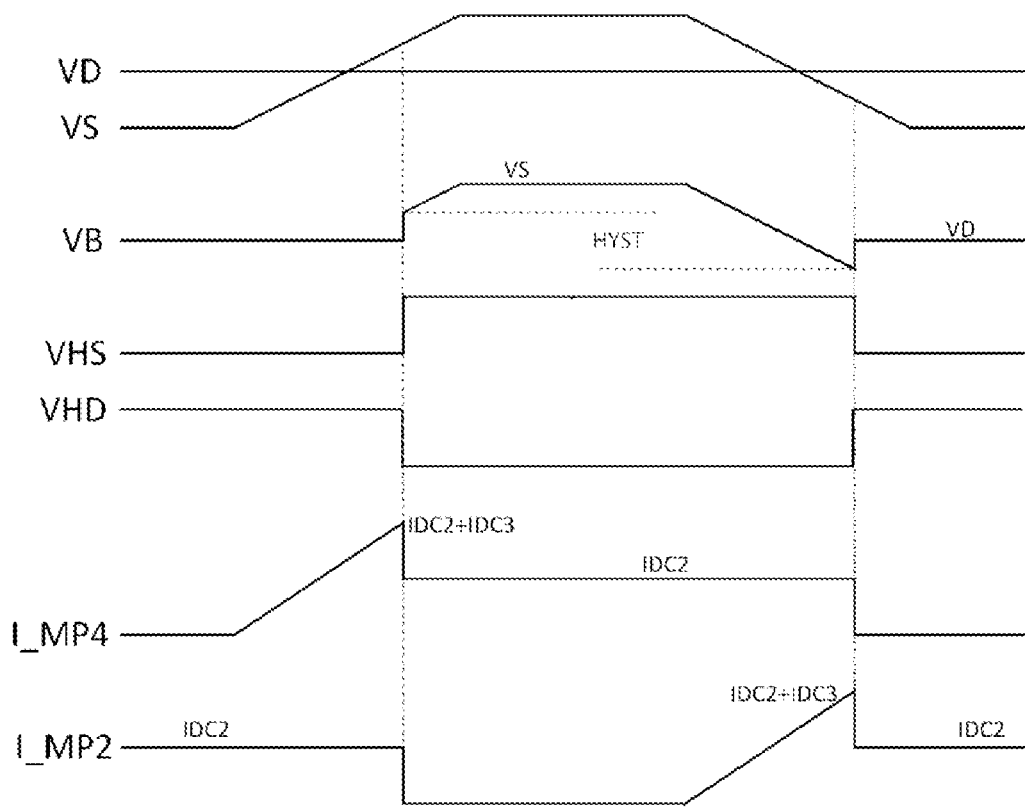

Let us then describe the operation of the biased comparator circuit of FIG. 2 with reference to FIG. 3 and a timing diagram of FIG. 4. FIG. 3 illustrates the same circuit diagram of FIG. 2 but with additional markings of voltages for some signal lines and, additionally, arrows illustrating a change in voltages in the circuit when the source voltage VS rises above the drain voltage VD. VHS and VHD represent voltages at the drains of the transistors MP4 and MP2, respectively. VPA and VPB represents gate voltages of the transistors MPA and MPB, respectively. When VPA goes to a LOW state, it closes the switch MPA, thus coupling the source voltage to the bulk. Similarly, when VPB goes to a LOW state, it closes the switch MPB, thus coupling the drain voltage to the bulk. VBPS and VBPD represent gate (bias) voltages of the first second and first current mirror circuits, respectively. Referring to FIGS. 3 and 4, let us assume a situation where the source voltage VS rises above the drain voltage. In such a case, the function of the circuit is to couple the source voltage to the load coupled to the bulks of the transistors MP0, MPA, MPB. The top diagram in FIG. 4 illustrates the source voltage VS starting to rise and close the drain voltage VD. Before VS crosses VD, the current flowing through the transistor MP4 (I_MP4 in FIG. 4) increases because its gate-to-source voltage is increasing. The reason is that the gate voltage VBPD remains fixed, driven by the current source IDC1 on the right of FIG. 3. Because of increasing source voltage of MP4 and the fixed gate voltage, transconductance of MP4 increases and so increases the current I_MP4. The load of MP4 is the constant current source IDC2 which again raises the voltage VHS to a high level at the threshold when the gate-to-source voltage of MP4 is high enough to drive both current sources IDC2 and IDC3 together, i.e. when the source voltage is sufficiently above the drain voltage (illustrated by IDC2+IDC3 in FIG. 4). As illustrated in FIGS. 2 and 3 and described above, VHS drives the transistors MN3 and MN4. When VHS goes high as a result of sufficiently high source voltage VS, MN3 couples VPA to the ground, thereby pulling VPA to a LOW state. As described above, low VPA will cause the transistor MPA to couple the source voltage to the load.

Accordingly, the second current mirror circuit effectively reduces impedance between the bulk voltage VB and the source voltage VS, thereby causing the coupling of the source voltage to the bulk and to the load. There is yet another mechanism in the circuit that affects the fast coupling of the source voltage to the load, and this mechanism is delivered via the first current mirror circuit. Since the transistor MP1 is also coupled to the source voltage and has a constant current source as its load, the transconductance and the gate-to-source voltage of MP1 increases in a similar manner as in MP4 which again causes decreasing gate-to-source voltage at the transistor MP2. As a consequence, the current source IDC2 at the load of the transistor MP2 causes VHD to be pulled to a LOW state, as illustrated in FIG. 4. This happens substantially simultaneously with triggering the VHS to the HIGH state. When the voltage VHD is at the LOW state, the transistors MN1 and MN2 are open which causes the voltage VPB to increase towards the source voltage, thus opening the switch MPB and defining a high impedance between the drain voltage and the bulk, thereby effectively decoupling the drain voltage from the bulk. This dual effect provides the comparator circuit MPA, MPB with fast coupling capability.

Then, let us follow the operation when the source voltage VS decreases below the drain voltage VD. Since the source voltage VS is coupled to the bulk of the transistors MP0, MPA, MPB, it also defines and equals to the bulk voltage VB at first. The decrease in the source voltage VS starts to increase the transconductance of MP2, thereby increasing the current I_MP2 flowing thorough MP2, as illustrated in FIG. 4. The current I_MP2 increases until it is high enough to drive both current sources IDC2 and IDC3 coupled at the load of the transistor MP2, i.e. when the source voltage is sufficiently below the drain voltage. At this stage, VHS goes to LOW state and VHD goes to HIGH state. When VHD goes HIGH as a result of sufficiently high drain voltage VD, MN2 couples VPB to the ground, thereby pulling VPB to a LOW state. As described above, low VPB will cause the transistor MPB to couple the source voltage to the load.

Accordingly, the first current mirror circuit effectively reduces impedance between the bulk voltage VB and the drain voltage VD, thereby causing the coupling of the drain voltage to the bulk and to the load. As was the case with the rising source voltage VS, the same dual mechanism in the circuit affects the fast coupling of the drain voltage to the load. Since the transistor MP3 is also coupled to the drain voltage and has a constant current source as its load, the transconductance and the gate-to-source voltage of MP3 increases in a similar manner as in MP2 which again causes decreasing gate-to-source voltage at the transistor MP4. As a consequence, the current source IDC2 at the load of the transistor MP4 causes VHS to be pulled to a LOW state. This happens substantially simultaneously with triggering the VHD to the HIGH state. When the voltage VHS is at the LOW state, the transistors MN3 and MN4 are open which causes the voltage VPA to increase towards the drain voltage, thus opening the switch MPA and defining a high impedance between the source voltage and the bulk, thereby effectively decoupling the source voltage from the bulk. Again, this dual effect provides the comparator circuit MPA, MPB with fast coupling capability.

The current sources IDC1 to IDC3 may be constant current generators configured to generate a constant current. In an embodiment, each current source having the same reference number IDC1, IDC2, or IDC3 may be identical. As a consequence, the current sources IDC1 as the load of the transistors MP1 and MP3 may be identical with respect to one another, as well as the current sources IDC2 and current sources IDC3. As described above in connection with FIGS. 3 and 4, the current sources IDC2 and IDC3 as loads of the current mirror circuits are configured to generate a non-zero hysteresis to the comparator switch. As illustrated in FIG. 4, the source voltage VS needs to rise above the drain voltage VD by a first threshold amount to trigger state transition in VHS and VHD and the coupling of the source voltage to the bulk. In the same manner, the source voltage needs to drop below the drain voltage VD by a second threshold amount to trigger state transition in VHS and VHD and the coupling of the drain voltage to the bulk. This is called hysteresis. The first and second threshold are in practice defined by the configuration of the current generators IDC2 and IDC3, as described above. When the current generators IDC2 are identical and IDC3 are identical, the first and second threshold may have equal (absolute) values. In an embodiment, the constant current sources IDC2 and IDC3 are configured independently to generate a different threshold voltage level for selecting the source voltage than a threshold voltage level for selecting the drain voltage. In such a case, at least one of the current sources IDC2, IDC3 at the load of the transistor MP4 may generate a different constant current than at least one of the current sources IDC2, IDC3 at the load of the transistor MP2. In other words, IDC2 at the load of the transistor MP4 may generate a different constant current than IDC2 at the load of the transistor MP2, and/or IDC3 at the load of the transistor MP4 may generate a different constant current than IDC3 at the load of the transistor MP2.

Figure 5:
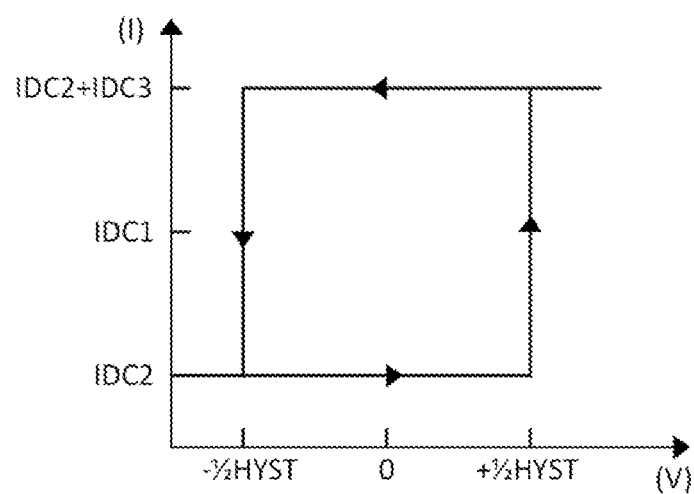
FIG. 5 illustrates a hysteresis effect according to an embodiment.

In an embodiment, the hysteresis voltage defining the threshold voltage levels and, as a consequence, the first and second threshold, is defined as a function of the constant current IDC_3 generated by the current source(s) IDC3, as follows:

$$V_{HYST} = 2 \cdot \sqrt{\frac{2 \cdot IDC_3 \cdot L_{MP2,4}}{\mu C'_{OX} \cdot W_{MP2,4}}}$$

where $\mu C'_{ox}$ is a complementary MOS (CMOS) process parameter describing mobility of the transistors MP2 and MP4, $L_{MP2,4}$ is a channel length of the transistors MP2 and MP4, and $W_{MP2,4}$ is a channel width of the transistors MP2 and MP4. Accordingly the hysteresis is defined by the current generated by the current sources IDC3 and transconductances of the transistors MP2 and MP4. FIG. 5 illustrates the hysteresis effect in a situation where the current sources IDC2 and current sources IDC3 are identical.

Referring to FIG. 5, the hysteresis voltage may be centred around zero voltage that represents a situation where the source voltage and threshold voltage are equal. Let us consider that the threshold level +½ HYST represents a threshold when the source voltage shall be coupled to the bulk, and the threshold level −½ HYST represents a threshold when the drain voltage shall be coupled to the bulk. When the source voltage rises so that it increases the transconductance of the transistor MP4 enough to overcome the current generated together by the current sources IDC2+IDC3 at its load, VHS goes HIGH and causes coupling of the source voltage to the bulk. When the source voltage VS decreases, the transconductance of MP4 decreases and, when it is low enough to generate less current than the current source IDC2 at its load, it will contribute to switching the drain voltage to the bulk. Transistor MP2 operates in the same manner for the drain voltage. The current generated by the current source(s) IDC1 may be defined as follows to achieve a balanced hysteresis:

$$I_{DC1} = I_{DC2} + \frac{1}{2} \cdot I_{DC3}$$

The apparatus of any preceding claim, wherein the first transistor, second transistor, and the third transistor are positive metal oxide semiconductor, PMOS, transistors, and wherein the apparatus comprises at least one further PMOS transistor and at least one negative metal oxide semiconductor, NMOS, transistor, wherein bulks of all PMOS transistors are coupled to the same bulk voltage, and wherein bulks of all NMOS transistors are coupled to the ground.

The current sources IDC1, IDC2, and IDC3 are active components that may be enabled or disabled. When the current sources are enabled, the comparator circuit operates in the above-described manner. However, the comparator circuit remains operational even in a state where the current sources are disabled. In such a case, the current sources can be seen as high impedances. The transistors MN2 and MN3 are also at high impedance in such a situation. As a consequence, the voltage VPB is coupled to the source voltage mainly via the first impedance circuit (resistor RU1), while the voltage VPA is coupled to the drain voltage mainly via the second impedance circuit (resistor RU2). Accordingly, the comparator functions substantially similarly to the circuit of FIG. 1. A technical effect is that the bulk switching can still be performed, e.g. during a start-up of the comparator circuit when the current sources have not yet been fully enabled. An advantage is that the bulk still follows the source voltage or drain voltage, which ever is coupled to the bulk by the comparator circuit.

Figure 6:
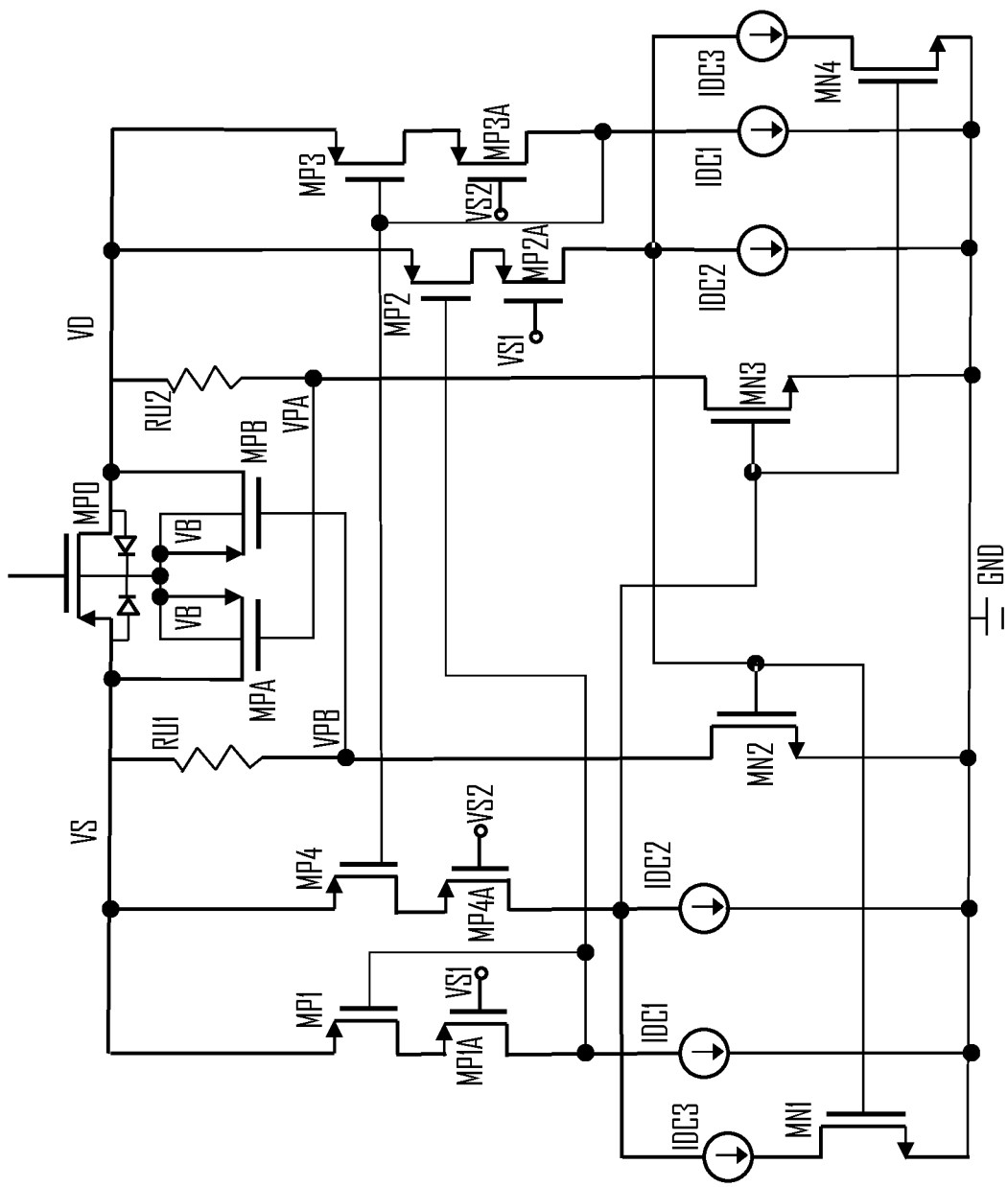
FIG. 6 illustrates a bulk switching circuitry according to yet another embodiment.

In an embodiment, at least one of the first current mirror circuit and the second current mirror circuit comprises a cascode of a plurality of current mirror circuits. In an embodiment, both of the first current mirror circuit and the second current mirror circuit comprises a cascode of a plurality of current mirror circuits. The cascode improves the response time of the circuit to the changes in the source voltage and drain voltage, thus improving the accuracy of the comparator and coupling. The cascode is not necessary to both current mirror circuits, e.g. in scenarios where extremely fast response to one of the source voltage and drain voltage is not required. FIG. 6 illustrates the embodiment where both current mirrors comprise a cascode of current mirrors. As illustrated in FIG. 6, each transistor MP1 to MP4 of the current mirrors of FIG. 2 is a part of a cascode of current mirrors. The transistors MP1, MP2 are cascoded with transistors MP1A, MP2A, respectively, while the transistors MP3, MP4 are cascoded with transistors MP3A, MP4A, respectively. The cascoded transistors are of the same type which is PMOS in this embodiment. Accordingly, the drains of the transistors MP1 to MP4 are coupled to sources of the transistors MP1A to MP4A, respectively. However, gates of the transistors MP1A, MP2A are coupled to VS1 which may be coupled to a supply voltage domain of the source voltage VS, while gates of the transistors MP3A, MP4A are coupled to VS2 which may be coupled to a supply voltage domain of the drain voltage VD. In some embodiments, the source voltage VS may be coupled to the gates of the transistors MP1A, MP2A directly or via a circuitry such as an impedance circuit. Similarly, the drain voltage VD may be coupled to the gates of the transistors MP3A, MP4A directly or via a circuitry such as an impedance circuit. The actual implementation for the circuit providing the bias to the transistors MP1A to MP4A may be designed according to the desired implementation, keeping in mind that sufficient operation headroom is given to the cascodes. The operation of the circuit is substantially similar to that described above in connection with FIGS. 3 and 4.

In an embodiment, the apparatus is or is comprised in a rectifier circuit or charger device. The apparatus according to the embodiments described herein may be used to rectify an alternating current or otherwise moving voltages, to charge a battery, etc.

Embodiments described herein are applicable to systems defined above but also to other systems. The protocols used, the specifications of the systems and their elements develop rapidly. Such development may require extra changes to the described embodiments. Therefore, all words and expressions should be interpreted broadly and they are intended to illustrate, not to restrict, the embodiment. It will be obvious to a person skilled in the art that, as technology advances, the inventive concept can be implemented in various ways. Embodiments are not limited to the examples described above but may vary within the scope of the claims.

The invention claimed is:

1. An apparatus comprising:
a bulk-controlled switch circuit comprising a first transistor coupled to a load and having a source coupled to a source voltage and a drain coupled to a drain voltage, a second transistor and a third transistor coupled, in parallel with the first transistor, to one another in series between the source voltage and the drain voltage, wherein a bulk of the first transistor is coupled with bulks of the second transistor and the third transistor, wherein a gate of the second transistor is coupled to the source voltage via a first impedance circuit and a gate of the third transistor is coupled to the drain voltage via a second impedance circuit to form a comparator switch controlled by the source voltage and the drain voltage and to dynamically switch a greater one of the source voltage and the drain voltage to the load;
a first current generator circuit and a second current generator circuit;
a first current mirror circuit biased by the first current generator circuit, responsive to the source voltage, and configured to trigger the second transistor to couple the source voltage to the load when the source voltage is above the drain voltage;
a second current mirror circuit biased by the second current generator circuit, responsive to the drain voltage, and configured to trigger the third transistor to couple the drain voltage to the load when the drain voltage is above the source voltage; and
constant current generators as loads of the first current mirror circuit and the second current mirror circuit and configured to generate a non-zero hysteresis to the comparator switch.

2. The apparatus of claim 1, wherein the constant current generators are configured to generate a different threshold voltage level for coupling the source voltage than a threshold voltage level for coupling the drain voltage.

3. The apparatus of claim 1, wherein the first impedance circuit comprises a first resistor between the gate of the second transistor and the source voltage, and the second impedance circuit comprises a second resistor between the gate of the third transistor and the drain voltage.

4. The apparatus of claim 3, wherein the first impedance circuit is coupled to the ground via a fourth transistor, and second impedance circuit is coupled to the ground via a fifth transistor, wherein the second current mirror circuit is coupled to a gate of the fourth transistor and the first current mirror circuit is coupled to a gate of the fifth transistor.

5. The apparatus of claim 1, wherein the first transistor, second transistor, and the third transistor are positive metal oxide semiconductor, PMOS, transistors, and wherein the apparatus comprises at least one further PMOS transistor and at least one negative metal oxide semiconductor, NMOS, transistor, wherein bulks of all PMOS transistors are coupled to the same bulk voltage, and wherein bulks of all NMOS transistors are coupled to the ground.

6. The apparatus of claim 5, wherein the first current mirror circuit and the second current mirror circuit each comprises a diode-coupled transistor and a current source transistor, wherein the current source transistor of the first current mirror circuit is coupled to a gate of a sixth transistor driving a constant current source that is a load of the current source transistor of the second current mirror circuit, and wherein the current source transistor of the second current mirror circuit is coupled to a gate of a seventh transistor driving a constant current source that is a load of the current source transistor of the first current mirror circuit.

7. The apparatus of claim 1, wherein the first current mirror circuit is configured to, in response to the source voltage rising above the drain voltage, to increase coupling of the source voltage to the load while the second current mirror circuit is configured to increase decoupling of the drain voltage to the load, and wherein the second current mirror circuit is configured to, in response to the drain voltage rising above the source voltage, to increase coupling of the drain voltage to the load while the first current mirror circuit is configured to increase decoupling of the source voltage to the load.

8. The apparatus of claim 1, wherein at least one of the first current mirror circuit and the second current mirror circuit comprises a cascode of a plurality of current mirror circuits.

9. The apparatus of claim 1, wherein the apparatus comprises a rectifier circuit comprising the bulk-controlled switch circuit, the first current generator circuit, the second current generator circuit, the first current mirror circuit, and the second current mirror circuit.

10. The apparatus of claim 1, wherein the apparatus comprises a charger device comprising the bulk-controlled switch circuit, the first current generator circuit, the second current generator circuit, the first current mirror circuit, and the second current mirror circuit.

11. An apparatus comprising:
a bulk-controlled switch circuit comprising
a first positive metal oxide semiconductor, PMOS, transistor having a bulk coupled to a load, and having a source coupled to a source voltage and a drain coupled to a drain voltage,
a second PMOS transistor and a third PMOS transistor coupled, in parallel with the first transistor, to one another in series between the source voltage and the drain voltage, wherein sources of the second and third PMOS transistors are coupled together, a drain of the second PMOS transistor is coupled to the source voltage, a drain of the third PMOS transistor is coupled to the drain voltage and a bulk of the first transistor is coupled with bulks of the second PMOS transistor and the third PMOS transistor are coupled to the bulk of the first PMOS transistor and to the load, wherein a gate of the second PMOS transistor is coupled to the source voltage via a first impedance circuit and a gate of the third PMOS transistor is coupled to the drain voltage via a second impedance circuit to form a comparator switch controlled by the source voltage and the drain voltage and to dynamically switch a greater one of the source voltage and the drain voltage to the load, the first impedance circuit being coupled to the ground via a fourth negative metal oxide semiconductor, NMOS, transistor, and a second impedance circuit being coupled to the ground via a fifth NMOS transistor;
a first current generator circuit and a second current generator circuit;

a first current mirror circuit biased by the first current generator circuit, responsive to the source voltage, and configured to trigger the second PMOS transistor to couple the source voltage to the load when the source voltage is above the drain voltage, wherein the first current mirror circuit is coupled to a gate of the fifth NMOS transistor;

a second current mirror circuit biased by the second current generator circuit, responsive to the drain voltage, and configured to trigger the third PMOS transistor to couple the drain voltage to the load when the drain voltage is above the source voltage, wherein the second current mirror circuit is coupled to a gate of the fourth NMOS transistor; and constant current generators acting as loads of the first current mirror circuit and the second current mirror circuit, wherein the constant current generators are configured to generate a non-zero hysteresis to the comparator switch, wherein the apparatus comprises at least one PMOS transistor in addition to the first, second and third PMOS transistors, bulks of all PMOS transistors of the apparatus are coupled to the same bulk voltage and bulks of all NMOS transistors of the apparatus are coupled to the ground.

* * * * *